(12) United States Patent
Lin

(10) Patent No.: US 9,329,243 B2
(45) Date of Patent: May 3, 2016

(54) APPARATUS AND METHOD OF LED SHORT DETECTION

(71) Applicant: Realtek Semiconductor Corp., Hsinchu (TW)

(72) Inventor: Shu Min Lin, Tai Chung (TW)

(73) Assignee: REALTEK SEMICONDUCTOR CORP., HsinChu (TW)

( * ) Notice: Subject to any disclaimer, the term of this patent is extended or adjusted under 35 U.S.C. 154(b) by 319 days.

(21) Appl. No.: 13/859,573

(22) Filed: Apr. 9, 2013

(65) Prior Publication Data

US 2013/0265056 A1    Oct. 10, 2013

(30) Foreign Application Priority Data

Apr. 10, 2012  (TW) .............................. 101112549 A

(51) Int. Cl.
*G01R 31/44* (2006.01)
*G09G 3/00* (2006.01)
*G01R 31/02* (2006.01)
*G01R 31/26* (2014.01)

(52) U.S. Cl.
CPC ................ *G01R 31/44* (2013.01); *G09G 3/006* (2013.01); *G01R 31/025* (2013.01); *G01R 31/2632* (2013.01)

(58) Field of Classification Search
None
See application file for complete search history.

(56) References Cited

U.S. PATENT DOCUMENTS

| 4,045,623 | A | * | 8/1977 | Arce | ........................ | H04Q 3/00 379/17 |
| 4,395,767 | A | * | 7/1983 | Van Brunt | ............ | G01R 31/046 714/724 |
| 4,435,700 | A | * | 3/1984 | Alley | ..................... | G08B 13/00 340/506 |
| 4,532,436 | A | * | 7/1985 | Bismarck | ......... | H03K 3/356104 326/62 |
| 4,891,743 | A | * | 1/1990 | May | ....................... | G01R 31/40 363/87 |
| 4,933,627 | A | * | 6/1990 | Hara | ...................... | G11C 5/147 323/313 |

(Continued)

FOREIGN PATENT DOCUMENTS

CN   102026438 A   4/2011
TW   201110811 A   3/2011

*Primary Examiner* — Jermele M Hollington
*Assistant Examiner* — Suresh K Rajaputra
(74) *Attorney, Agent, or Firm* — Muncy, Geissler, Olds & Lowe, P.C.

(57) ABSTRACT

An apparatus and method for detecting a status of at least one of a plurality of light emitting diodes (LEDs), is disclosed in embodiments of the invention. The apparatus includes a first node, a second node, a voltage generator, a current source and a first comparator. The voltage generator generates an output voltage to the first external circuit via the second node. The current source provides a current to the first external circuit via the first node to generate a first node voltage. The first comparator generates a first comparison result according to the first node voltage and a reference voltage, wherein the first comparison result indicates whether the status of at least one of the LEDs is short or not.

17 Claims, 8 Drawing Sheets

(56) References Cited

U.S. PATENT DOCUMENTS

| | | | | |
|---|---|---|---|---|
| 5,576,637 A * | 11/1996 | Akaogi | G05F 3/205 | 326/54 |
| 5,684,415 A * | 11/1997 | McManus | H03K 19/018521 | 326/27 |
| 5,781,026 A * | 7/1998 | Chow | H03K 3/356147 | 326/26 |
| 6,075,448 A * | 6/2000 | Verkhovskiy | G01R 15/12 | 324/133 |
| 6,243,314 B1 * | 6/2001 | Seol | G11C 7/065 | 365/185.21 |
| 6,515,434 B1 * | 2/2003 | Biebl | B60Q 1/2696 | 315/185 R |
| 6,888,454 B2 * | 5/2005 | Kurose | G09G 3/006 | 324/537 |
| 7,005,908 B2 * | 2/2006 | Lee | H03K 17/223 | 326/68 |
| 7,420,356 B2 * | 9/2008 | Hojo | H02M 3/156 | 323/276 |
| 7,446,481 B2 * | 11/2008 | Kang | H05B 33/0818 | 315/185 R |
| 7,450,460 B2 * | 11/2008 | Yamada | G11C 5/14 | 365/189.02 |
| 7,550,934 B1 * | 6/2009 | Deng | H05B 33/0887 | 315/209 R |
| 7,675,246 B2 * | 3/2010 | Chiang | H05B 33/0815 | 315/291 |
| 7,719,262 B2 * | 5/2010 | Hardie | H03K 17/9512 | 324/207.13 |
| 7,876,103 B2 * | 1/2011 | Mihai | H05B 33/089 | 315/129 |
| 8,013,773 B2 * | 9/2011 | Chang | H03M 1/0682 | 341/155 |
| 8,330,491 B2 * | 12/2012 | Nedalgi | H03K 19/018521 | 326/113 |
| 8,334,662 B2 * | 12/2012 | Jin et al. | | 315/299 |
| 8,344,661 B2 * | 1/2013 | Hsu | H05B 33/0815 | 315/291 |
| 8,456,096 B2 * | 6/2013 | Kwok | H02M 1/32 | 315/219 |
| 8,552,971 B2 * | 10/2013 | Ishikawa | G09G 3/3426 | 315/193 |
| 8,558,463 B2 * | 10/2013 | Sato | H05B 33/0893 | 315/130 |
| 8,686,653 B2 * | 4/2014 | Gao | G09G 3/342 | 315/185 R |
| 8,896,319 B2 * | 11/2014 | Liao | H05B 33/0827 | 315/192 |
| 8,947,343 B2 * | 2/2015 | Kim | G09G 3/006 | 345/102 |
| 8,970,115 B2 * | 3/2015 | Myers | H05B 37/038 | 315/122 |
| 9,060,399 B2 * | 6/2015 | Lin | H05B 33/0815 | |
| 2002/0141121 A1 * | 10/2002 | Brohlin | H02H 3/243 | 361/18 |
| 2003/0160703 A1 * | 8/2003 | Kurose | G09G 3/006 | 340/815.45 |
| 2007/0205793 A1 * | 9/2007 | Wang | G01R 31/025 | 324/762.07 |
| 2009/0002034 A1 * | 1/2009 | Westendorp | G01R 19/16519 | 327/77 |
| 2009/0085542 A1 * | 4/2009 | Numano | H03K 17/785 | 323/282 |
| 2009/0155674 A1 * | 6/2009 | Ikeuchi | G01R 31/3624 | 429/91 |
| 2009/0251118 A1 * | 10/2009 | Omi | H02M 1/36 | 323/282 |
| 2010/0060501 A1 * | 3/2010 | Chang | H03M 1/0682 | 341/159 |
| 2010/0085074 A1 * | 4/2010 | Yinn | G01R 31/025 | 324/764.01 |
| 2010/0169031 A1 * | 7/2010 | Dishman | G01R 31/40 | 702/60 |
| 2010/0181941 A1 * | 7/2010 | Kuo | H05B 33/089 | 315/320 |
| 2010/0201283 A1 * | 8/2010 | Kawata | H05B 33/0818 | 315/287 |
| 2010/0327835 A1 * | 12/2010 | Archibald | H05B 33/0818 | 323/282 |
| 2011/0062872 A1 * | 3/2011 | Jin | H05B 33/0818 | 315/122 |
| 2011/0193542 A1 * | 8/2011 | Kwok | H02M 1/32 | 323/284 |
| 2011/0273101 A1 * | 11/2011 | Liu | G09G 3/3406 | 315/192 |
| 2012/0068714 A1 * | 3/2012 | Wang | G01R 31/025 | 324/414 |
| 2012/0074845 A1 * | 3/2012 | Aoki | H05B 33/0845 | 315/119 |
| 2012/0086359 A1 * | 4/2012 | Wang | H05B 33/0827 | 315/294 |
| 2012/0139421 A1 * | 6/2012 | Lee | H05B 33/0887 | 315/122 |
| 2012/0153846 A1 * | 6/2012 | Li | H05B 33/0827 | 315/186 |
| 2012/0188673 A1 * | 7/2012 | Teggatz | G01R 19/16552 | 361/64 |
| 2012/0286753 A1 * | 11/2012 | Zhong | H05B 33/0827 | 323/282 |
| 2012/0293082 A1 * | 11/2012 | Huang | H05B 33/089 | 315/192 |
| 2012/0326633 A1 * | 12/2012 | Enenkel | H05B 33/0842 | 315/312 |
| 2013/0020946 A1 * | 1/2013 | Boezen | H05B 33/0887 | 315/127 |
| 2013/0082615 A1 * | 4/2013 | Williams | H05B 33/0827 | 315/186 |
| 2013/0147361 A1 * | 6/2013 | Kang | H05B 33/089 | 315/122 |
| 2013/0221978 A1 * | 8/2013 | Liao | H05B 33/0827 | 324/537 |

* cited by examiner

APPARATUS AND METHOD OF LED SHORT DETECTION

This application claims the benefit of the filing date of Taiwan Application Ser. No. 101112549, filed on Apr. 10, 2012, the content of which is incorporated herein by reference.

BACKGROUND OF THE INVENTION

1. Field of the invention

The invention relates to electronic circuits, and more particularly, to an apparatus and method for detecting LED short circuit.

2. Description of the Related Art

A display panel is applied to many kinds of electronic products recently, such as a digital TV, a digital monitor, a smart phone, a notebook, a tablet PC . . . etc. A display panel includes a backlight device for providing lights to display images. Currently, a plurality of light emitting diodes (LEDs) are used as a light source of a common backlight device. Usually, the LEDs are connected into four LED strings or eight LED strings and the display panel controls its backlight by controlling each of the LED strings.

In general, a traditional LED short detection method applied to a backlight controller of the backlight device is to detect a cathode voltage (ISEN) of a LED string. When a LED string has a short circuit, a voltage across the LED string is reduced so that the cathode voltage (ISEN) of the LED string is increased. Thus the number of short circuits of a LED string can be obtained by detecting a cathode voltage (ISEN) of a LED string. However, a voltage across a LED string is usually 30~60 volts. Due to the high across voltage (30~60 volts), a traditional LED short detection circuit needs to be implemented by a high-voltage process to achieve a function of detecting the number of short circuits in a LED string. Therefore a traditional LED short detection circuit based on a high-voltage process can not be integrated into an integrated circuit based on a normal low-voltage process, especially for a system on chip (SOC).

Further a backlight controller is used to control luminance of LEDs. In general, the larger the size of a display panel, the more the number of LED strings or the more the number of LEDs in each LED string are set in the display panel. If fewer pins of a backlight controller are enough to perform a LED short detection on a LED string, it can save the cost of pins of the backlight controller. On the contrary, if more pins of a backlight controller are needed to perform a LED short detection on a LED string, the number of pins of the backlight controller is increased so as to increase production cost.

Since there are problems with a traditional LED short detection method, the present invention provides an apparatus and method for detecting LEDs short circuit to overcome the above mentioned problems.

SUMMARY OF THE INVENTION

In view of the above mentioned problem, an apparatus and method for detecting LED short circuit is disclosed in embodiments of the present invention.

According to an embodiment of the invention, an apparatus for detecting a status of at least one of a plurality of first light emitting diodes (LEDs) in a first external circuit is disclosed. The apparatus includes a first node, a second node, a voltage generator, a current source a first comparator. The first node and a second node are coupled to the first external circuit. The voltage generator generates an output voltage to the first external circuit via the second node. The current source, coupled to the first external circuit via the first node, provides a current to the first external circuit via the first node to generate a first node voltage. The first comparator, coupled to the first node, generates a first comparison result according to the first node voltage and a reference voltage. The first comparison result indicates whether the status of at least one of the first LEDs is short or not.

According to an embodiment of the invention, a method for detecting a status of a first light emitting diode (LED) string is disclosed. The first LED string comprises a plurality of first LEDs connected in series and the first LED string is coupled to a high-voltage device. The method includes the following steps: providing a first current to the first LED string of a first external circuit via a first node and the high-voltage device; providing a control voltage to a control input of the high-voltage device to generate a first node voltage at the first node according to the first current flowing through the first LED string; and generating a first comparison result according to the first node voltage and a reference voltage; wherein the first comparison result indicates whether the status of at least one of LEDs in the first LED string is short.

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

DETAILED DESCRIPTION OF THE INVENTION

Figure 1:
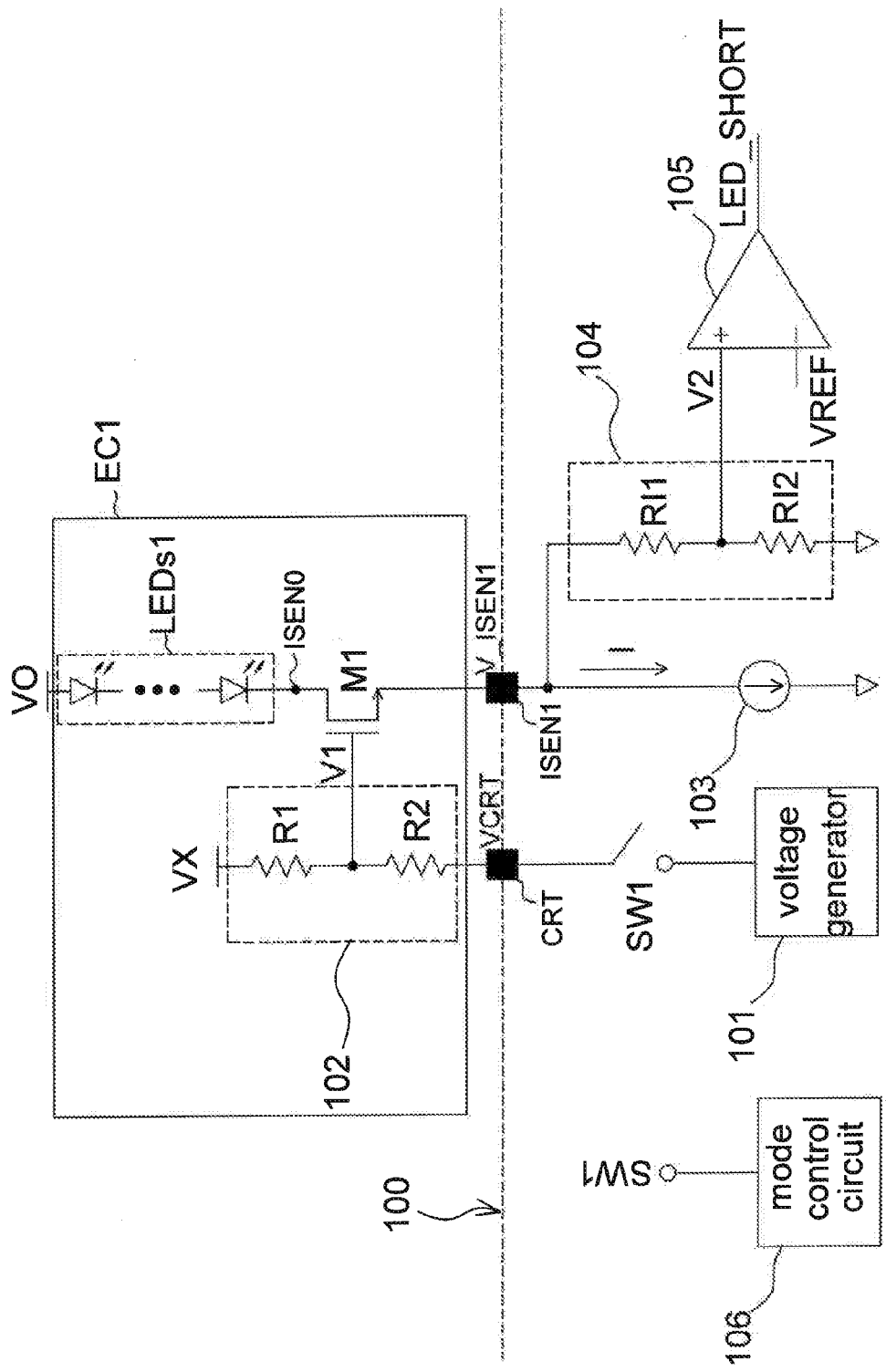
FIG. 1 shows an embodiment of an apparatus for LED short detection according to the present invention.

FIG. 1 depicts an apparatus 100 for detecting a status of at least one of a plurality of first light emitting diodes (LEDs) in a first external circuit, consistent with an embodiment of the present disclosure. The apparatus 100 is coupled to a first external circuit EC1 via a first node ISEN1 and a second node CRT. In an embodiment, the first external circuit EC1 includes at least a first LED string LEDs1. The first LED string LEDs1 includes a plurality of light emitting diodes (LED) connected in series. The apparatus 100 is used for detecting whether at least a LED of the first LED string LEDs1 is short-circuited. The apparatus 100 includes a voltage generator 101, a (adjustable) current source 103, a second voltage divider 104 and a first comparator 105. In an embodiment, the first node ISEN1 and the second node CRT are different pins of an integrated circuit (IC).

The first external circuit EC1 may include many aspects. In an embodiment, the first external circuit EC1 further includes a first voltage divider 102 and a high voltage device M1. The first voltage divider 102, coupled to the second node CRT and the gate of the first high voltage device M1 to generate a control voltage. In an embodiment, the first voltage divider 102 is coupled between a working voltage VX and the second node CRT having a controllable second node voltage VCRT. The first voltage divider 102 receives the second node voltage VCRT and divides a voltage difference between the working voltage VX and the second node voltage VCRT among two impedance elements (e.g. a resistor R1 and R2) to generate a first divided voltage V1 at an output end of the first voltage divider 102. Further, a voltage value of the first divided voltage V1 may equal to a formula of V1=(R2*VX+R1*VCRT)/(R1+R2). Since the second node voltage VCRT is controllable, the first divided voltage V1 is also controllable.

The first high voltage device M1, coupled between the first LED string LEDs1 and the current source 103, wherein a gate of the first high voltage device M1 receives the control voltage and the first high voltage device M1 is on or off status according to the control voltage. Specifically, a gate of the high voltage device M1 is coupled to the output end of the first voltage divider 102. That is, the gate of the high voltage device M1 receives the first divided voltage V1 as the control voltage. In other words, a working area of the high voltage device M1 can be controlled by the first divided voltage V1. The voltage generator 101 is used to generate the second node voltage (output voltage) VCRT to the first external circuit EC1 via the second node CRT The current source 103 is coupled to the first external circuit EC1 via the first node ISEN1 and provides a current I to the first external circuit EC1 via the first node ISEN1 to generate a first node voltage V_ISEN1. Specifically, the first external circuit EC1 receives the current I that flows via the first LED string LEDs1 and drives the first LED string LEDs1 to emit light, and then the first external circuit EC1 generates the first node voltage V_ISEN1 at the first node ISEN1 according to a control voltage (e.g. the divided voltage V1 generated from the second node voltage VCRT or the working voltage VX). In an embodiment, the current source 103 may be an adjustable current source.

The second voltage divider 104 is coupled to the first node ISEN1 to receive the first node voltage V_ISEN1. The second voltage divider 104 divides the first node voltage V_ISEN1 among two impedance elements (e.g. a resistor RI1 and RI2) to generate a second divided voltage V2 to the first comparator 105. If a voltage level of the first node voltage V_ISEN1 is within a working area of the first comparator 105, the first node voltage V_ISEN1 does not need to be divided and the second voltage divider 104 can be omitted.

The first comparator 105, coupled to the first node ISEN1, generates a first comparison result according to the first node voltage V_ISEN1 and a reference voltage VREF. In an embodiment, the first comparator 105 includes two input ends. The first input end is coupled to the first node ISEN1 and the second input end receives a reference voltage VREF. When the second voltage divider 104 is omitted, the two input ends of the first comparator 105 receive the first node voltage V_ISEN1 and the reference voltage VREF separately, and the first comparator 105 compares the first node voltage V_ISEN1 and the reference voltage VREF to generate a first comparing signal LED_SHORT which indicates whether the status of at least one of the first LEDs in the first LED string LEDs1 is short or not When the second voltage divider 104 is included, the two input ends of the first comparator 105 receive the voltage V2 and the reference voltage VREF separately, and the first comparator 105 compares the voltage V2 and the reference voltage VREF to generate the first comparing signal LED_SHORT which indicates whether at least a light emitting diode of the first LED string LEDs1 is short-circuited. Further a voltage value of the reference voltage VREF is set according to a voltage across the first LED string LEDs1. For instance, the voltage value of the reference voltage VREF is set to equal to or slightly smaller (or higher) than a short-circuit voltage of the first LED string LEDs1. When the second divided voltage V2 is higher than the reference voltage VREF, the first comparator 105 determines that there is at least one LED of the first LED string LEDs1 having a short circuit condition so as to enable the first comparing signal LED_SHORT. In other words, the comparator 105 generates the first comparing signal LED_SHORT according to a voltage level on the first node ISEN1.

Consistent with embodiments of the present disclosure, the apparatus 100 and method thereof uses an external high voltage device M1 to block (resist) a high voltage (such as 30~60 volts) at a node ISEN0 when a current flows through (increases brightness of) the first LED string LEDs1. Applying a suitable voltage to the gate of the high voltage device M1 can ensure that the first node voltage V_ISEN1 is smaller than an upper limit voltage of the apparatus 100. In an embodiment, for ensuring that a detection circuit of an integrated circuit (such as the first comparator 105) can detect the first node voltage V_ISEN1 on the first node ISEN1, the high voltage device M1 operates in a linear region and the gate voltage of the high voltage device M1 needs to be higher than a detected short-circuit voltage of the first LED string LEDs1. In an embodiment, a voltage applied to the gate of the high voltage device M1 is higher enough to drive the high voltage device M1 to operate in a linear region.

In an embodiment, the high voltage device M1 may be a transistor of type 2N7002. In another embodiment, the high voltage device M1 may be a replicate of any other type of transistor.

Figure 2:
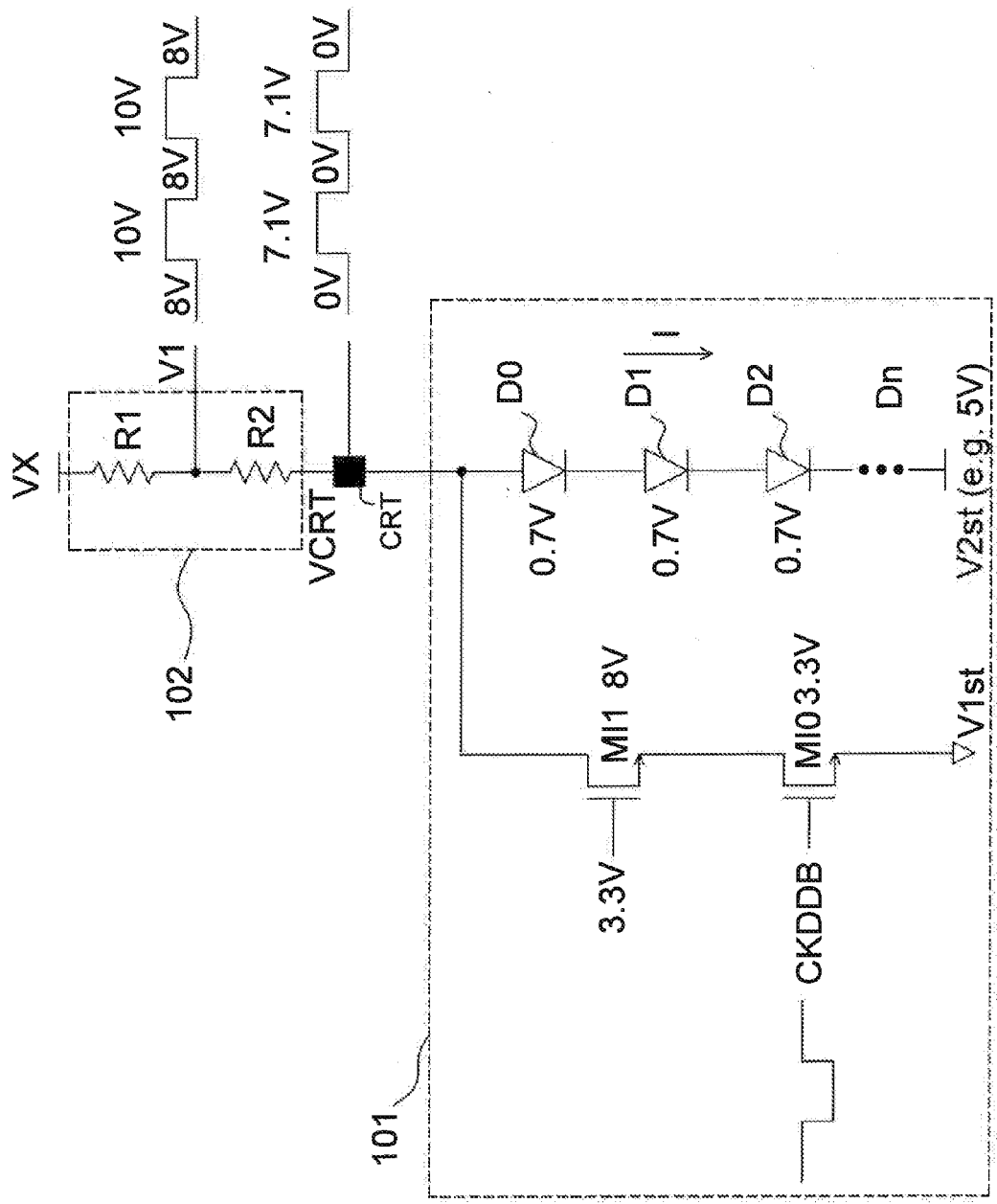
FIG. 2 shows an embodiment of a voltage generator according to the invention.

FIG. 2 depicts a voltage generator 101, consistent with an embodiment of the present disclosure. The voltage generator 101 includes a first transistor MI0 coupled in series with a second transistor MI1 and a plurality of diodes D0~DN coupled in series to form a diode stream.

The first transistor MI0 coupled in series with the second transistor MI1 of the voltage generator 101 is coupled between a first power V1st and the second node CRT. A third end (control end) of the first transistor MI0 receives an inverted clock signal CKDDB. The inverted clock signal CKDDB is an inversion signal of a clock signal CKDD (not shown) and the clock signal CKDD is used to perform digital dimming on the first LED string LEDs1.

The diode stream D0~Dn of the voltage generator 101 is coupled between a second power V2st and the second node CRT.

When a logic value of the clock signal CKDD equals one and the inverted clock signal CKDDB equals zero, the clock generator 101 starts to perform digital dimming on the first LED string LEDs1 and turns off the first transistor MI0. In the meantime, if the second node voltage VCRT is higher than the second power voltage V2st (e.g. 5 Volts), a current I flows through a diode D, D1 and D2 to the second power voltage V2st. Assuming that a threshold voltage Vth of each diode of diode stream D0~Dn equals 0.7 Volts and then in this embodiment shown in FIG. 2, the second node voltage VCRT equals to 7.1 Volts. Further the first voltage divider 102 receives the second node voltage VCRT and generates the first divided voltage V1.

Further the value of the first divided voltage V1 is determined by a preset impedance of the first voltage divider 102. In an embodiment (FIG. 4A), the first divided voltage V1 outputted by the first voltage divider 102 may equal the reference voltage VREF plus the threshold voltages Vth of the diode stream D0~Dn. The first divided voltage V1 may equal a formula V1=VREF+Vth (e.g. 10 Volts).

When a logic value of the clock signal CKDD equals zero and the inverted clock signal CKDDB equals one, the clock generator 101 stops performing digital dimming on the first LED string LEDs1 and turns on the first transistor MI0. Therefore a voltage level of the second node voltage VCRT is pulled down to V1st (e.g. 0 Volt) and a voltage across the diode stream D0~Dn is changed to be an inverse bias so that there is no current flowing through the diode stream D0~Dn. Meanwhile the gate of the high voltage device M1 receives the divided voltage V1 from the output of the voltage divider 102 and the divided voltage V1 from the output of the voltage divider may equal eight volts. Thus the second node voltage VCRT can be switched between 7.1 volts and zero volts, as shown in FIG. 2, in response to starting or stopping to perform digital dimming operated by the clock generator 101. Further the divided voltage V1 coupled to the high voltage device M1 can be switched between eight volts and ten volts to control the high voltage device M1 to operate in a working region.

In an embodiment, the second transistor MI1 of the voltage generator 101 may be a LDnMOS with eight-volt withstand voltage and the first transistor MI0 of the voltage generator 101 may be a MOS with 8-volt withstand voltage or 3.3-volt withstand voltage. Please note that the second transistor MI1 and the first transistor MI0 may be a replicate of any other type of transistor. In an embodiment, a breakdown voltage of the second transistor MI1 is different from a breakdown voltage of the first transistor MI0. In another embodiment, the second transistor MI1 may be a withstand transistor for protecting the first transistor MI0. In other words, a breakdown voltage of the second transistor MI1 is higher than or equal to that of the first transistor MI0.

Figure 5:
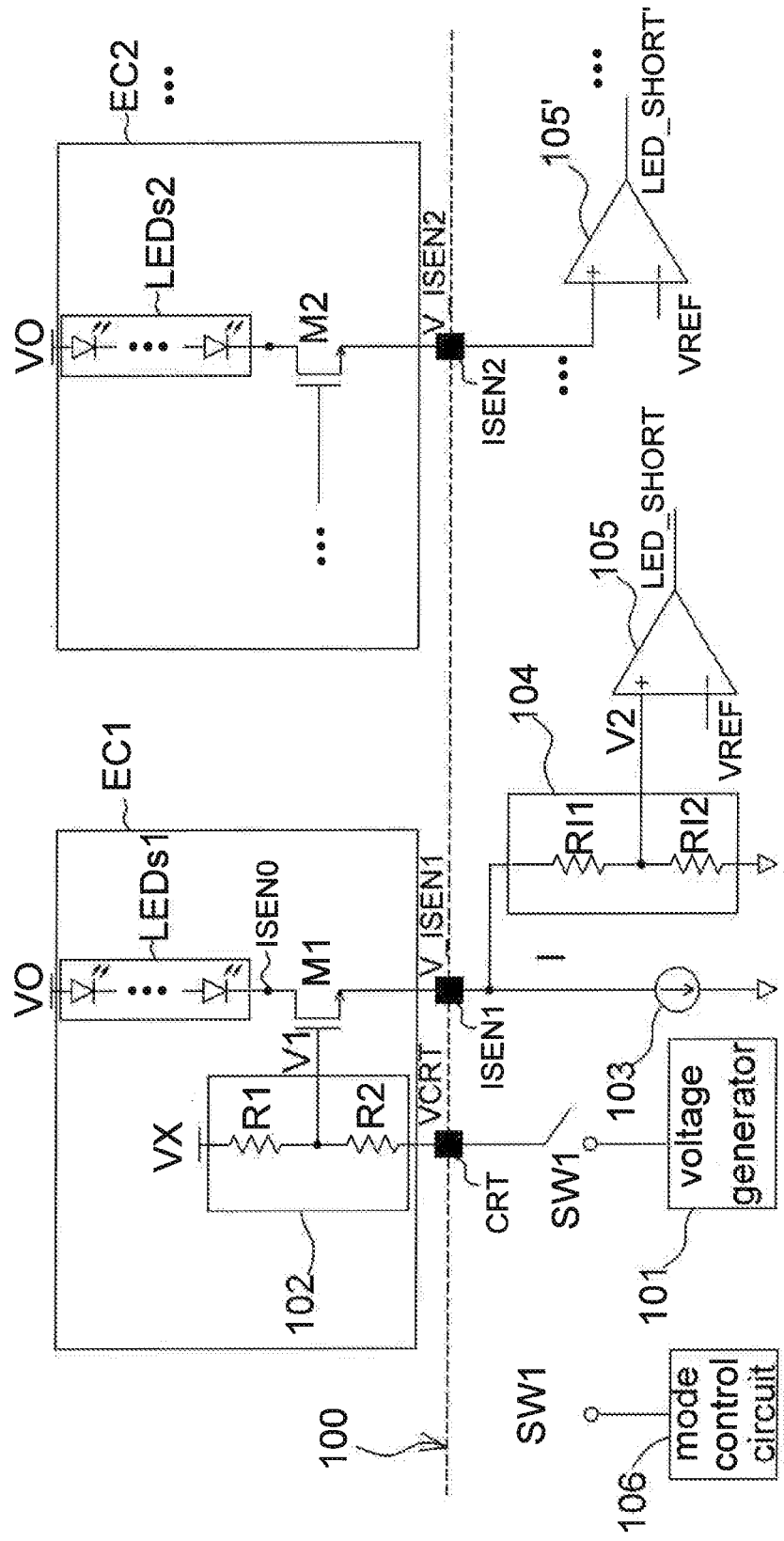
FIG. 5 shows another embodiment of an apparatus for LED short detection according to the present invention.

Please note that, as shown in FIG. 5, an apparatus 100 consistent with an embodiment of the present disclosure may includes at least a third node ISEN2 and at least a second comparator 105' for detecting a plurality of LED strings LEDs2, LEDs3 (not shown) . . . etc. The third node ISEN2 is coupled to a second external circuit EC2. The second external circuit EC2 includes a plurality of light emitting diodes which are connected in series to form the second LED string LEDs2. The second comparator 105' is coupled to the third node ISEN2 to generate a second comparison result according to a voltage at the third node ISEN2 and the reference voltage VREF. Specifically, the second comparator 105' includes two input ends, wherein one input end is coupled to the third node ISEN2 and the other input end receives the reference voltage VREF. Further the second comparator 105' compares a third node voltage V_ISEN2 at the third node ISEN2 and the reference voltage VREF to generate a second comparing signal LED_SHORT' which indicates whether the status of at least one of the second LEDs (second LED string LEDs2) is short or not. Since the working principle of the second comparator 105' is the same as the first comparator 105, a detail description for the second comparator 105' is omitted.

Figure 3:
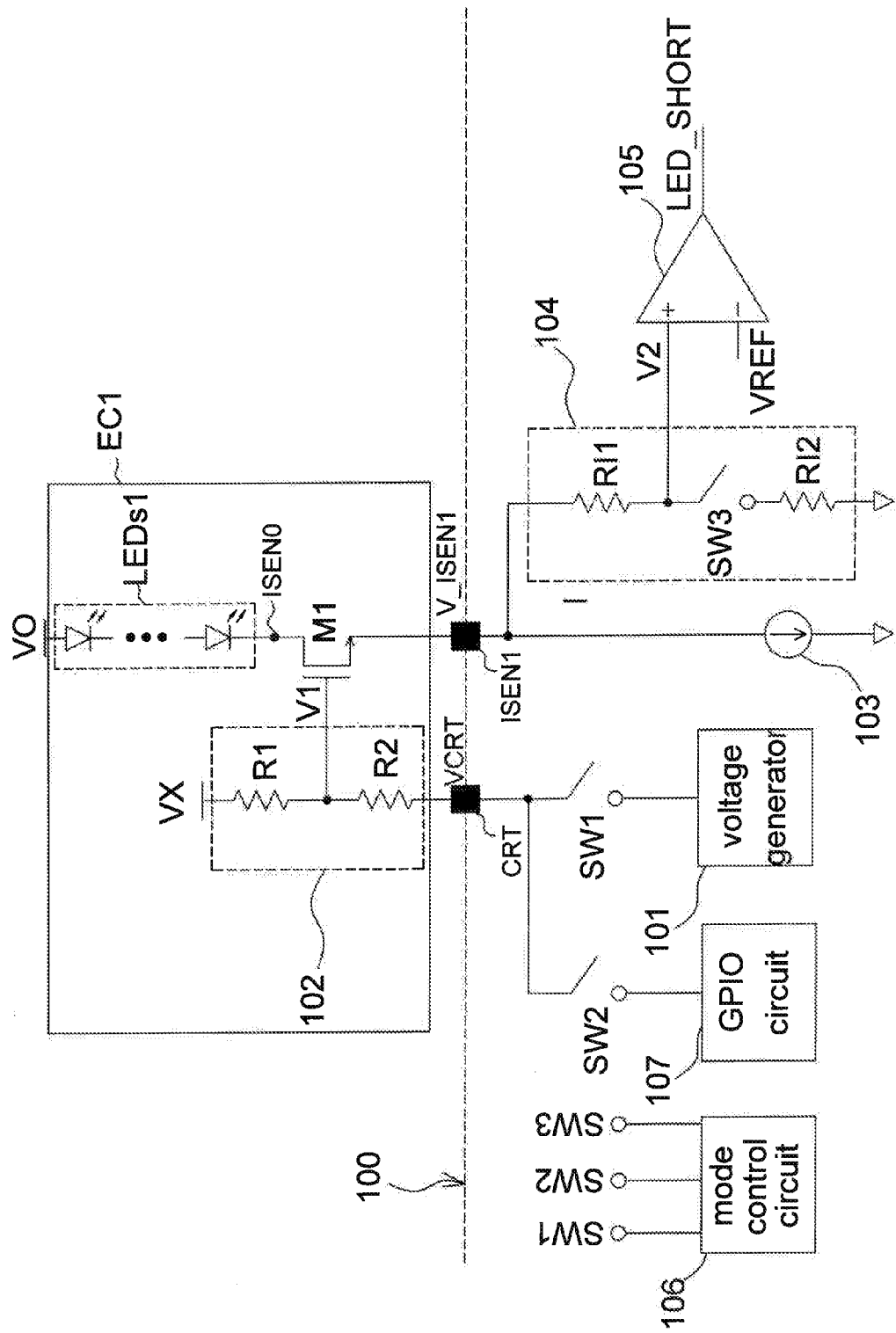
FIG. 3 shows another embodiment of an apparatus for LED short detection according to the present invention.
Figure 4A:
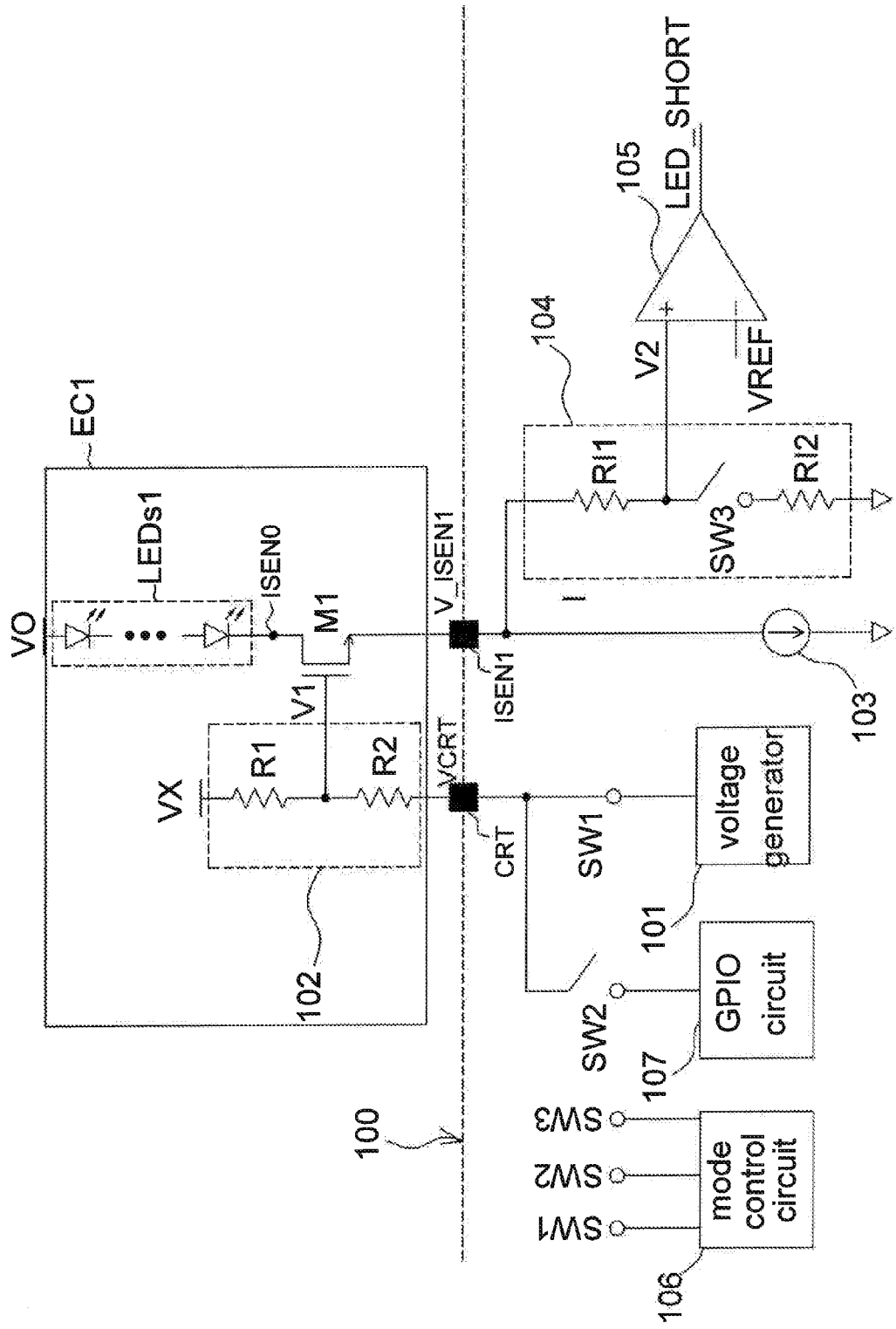
FIG. 4A shows a mode of an apparatus for LED short detection according to the present invention.
Figure 4B:
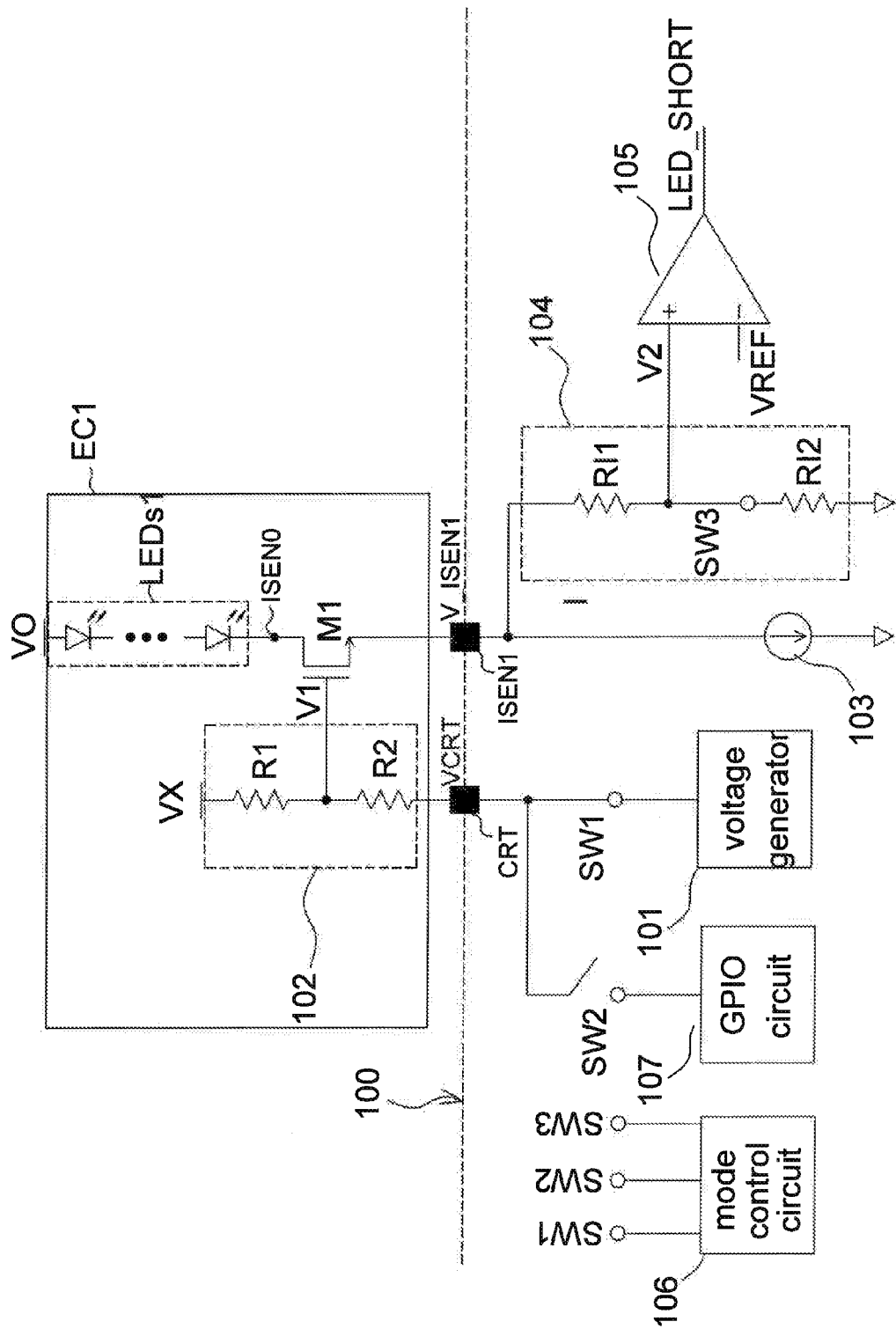
FIG. 4B shows another mode of an apparatus for LED short detection according to the present invention.
Figure 4C:
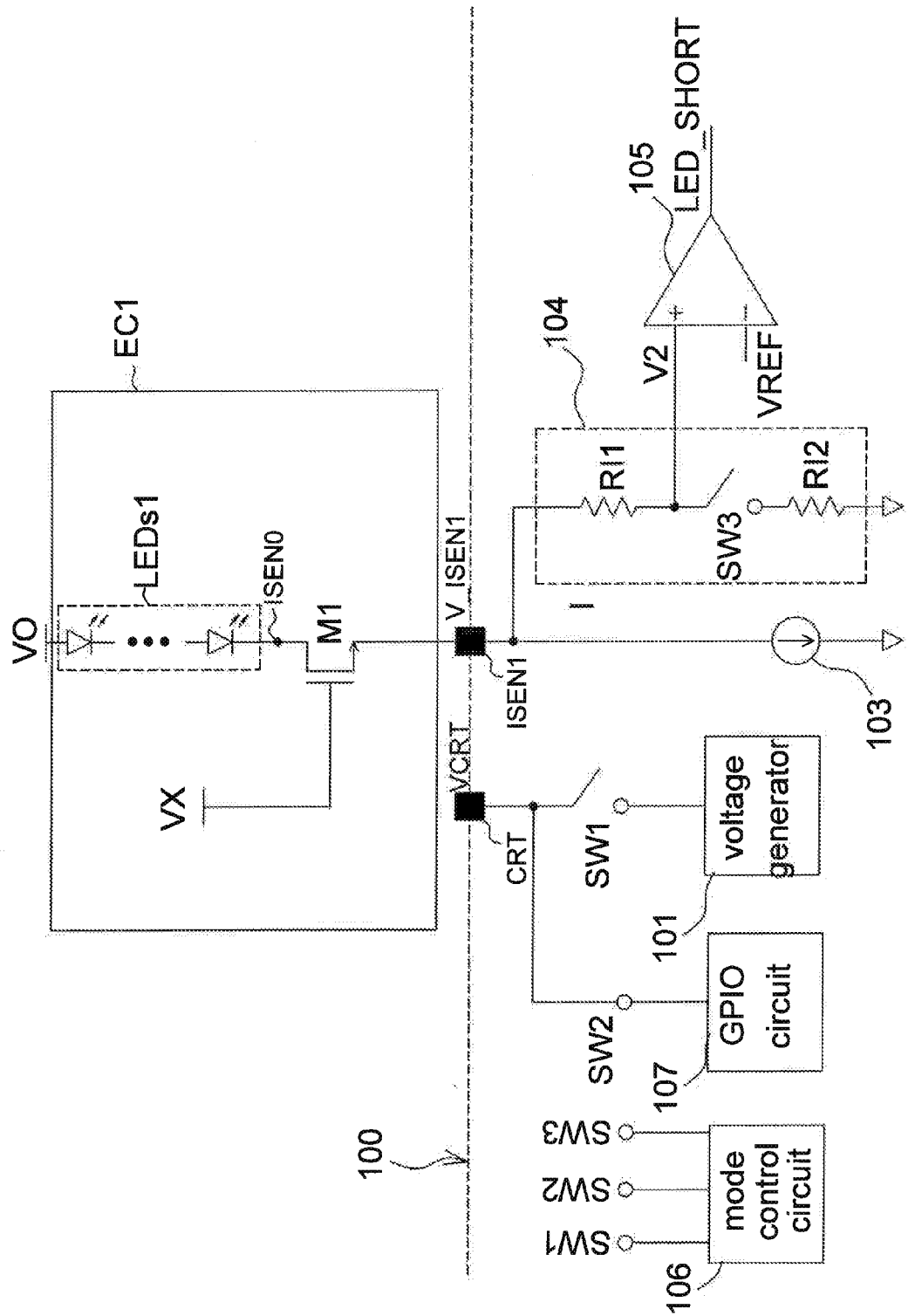
FIG. 4C shows another mode of an apparatus for LED short detection according to the present invention.

As shown in FIG. 3, an apparatus 100 consistent with an embodiment of the present disclosure may include a mode control circuit 106. The mode control circuit 106 includes a plurality of control modes for setting different LED backlight controllers of different integrated circuits. In an embodiment, the mode control circuit 106 includes a plurality of control modes to control a plurality switches SW1 ' SW2~SWN. Accordingly, setting different parameters to the mode control circuit 106 to select a corresponding control mode to determine ON/OFF states of the plurality switches SW1 ' SW2~SWN. Examples of determining ON/OFF states of switches by the mode control circuit 106 to select predetermined coupling circuits in an integrated circuit are shown in FIGS. 4A, 4B and 4C. Further, as shown in FIG. 3, the mode control circuit 106 may set the ON/OFF state of the switch SW2 to determine whether the second node (pin) CRT is coupled to the GPIO circuit 107, or set the ON/OFF state of the switch SW1 to determine whether the second node (pin) CRT is coupled to the voltage generator 101. Therefore the GPIO circuit 107 and the voltage generator 101 may share the second node (pin) CRT so as to reduce pins of a chip. In another embodiment, the mode control circuit 106 controls the plurality of switches SW1' SW2~SWN such that an internal circuit may be coupled to the second node CRT, and the voltage generator 101 is not coupled to the second node CRT. In other words, the GPIO 107 may be replaced by other internal circuit of an Integrated circuit.

In an embodiment, as shown in FIG. 4A, the apparatus 100 enters a first detecting mode to detect whether at least a light emitting diode of the first LED string LEDs1 is short-circuited. When the voltage generator 101 enters a dimming off state, a voltage across the first LED string LEDs1 having a short condition may be higher than the first node voltage V_ISEN1. In the dimming off state, the second node voltage equals zero volts. For detecting short circuit of the first LED string LEDs1, the first detecting mode of the mode control circuit 106 is selected for turning on the switch SW1 and turning off the switches SW2 and SW3 to control the voltage generator 101 being coupled to the second node CRT. Further while the voltage generator 101 enters a dimming on state, the second node voltage VCRT can be applied to the second node CRT, and the first voltage divider 102 divides the second node voltage VCRT to generate the divided voltage V1 at the gate of the high voltage device M1. Since the second node voltage VCRT can be controlled by the voltage generator 101, a voltage value of the divided voltage V1 in the dimming on state can be controlled to be higher than a voltage value of the divided voltage V1 in the dimming off state. Thus, in the dimming on state, the high voltage device M1 is turned on to allow a current to flow through the first LED string LEDs1, the high voltage device M1, the first node ISEN1 and a resistor RI1 of a second voltage divider 104 to generate a voltage V2 at a non-inverting input end of the first comparator 105. The first comparator 105 compares the voltage V2 and the reference voltage VREF to generate a first comparing signal LED_SHORT which indicates whether at least a light emitting diode of the first LED string LEDs1 is short-circuited. Please note that, in this first detecting mode, only two nodes CRT and ISEN1 are used so that the apparatus 100 of LED short detection of an embodiment of the present invention can reduce pins of an integrated circuit to solve the problem of prior art.

In an embodiment, as shown in FIG. 4B, the apparatus 100 enters a second detecting mode to detect whether at least a light emitting diode of the first LED string LEDS1 is short-circuited. In the second detecting mode, it is assumed that a withstand voltage of elements of an integrated circuit is smaller than the first node voltage V_ISEN1 at the first node ISEN1 when the voltage generator 101 enters the dimming off state. For protecting an Integrated circuit, the mode control circuit 106 selects the second detecting mode by turning on the switches SW1 and SW3, and turning off the switch SW2 to control the second voltage divider 104 to divide the first node voltage V_ISEN1 to generate the voltage V2. Thus the voltage V2 at the non-inverting input end is smaller than the withstand voltage of the elements of the integrated circuit according to a preset impedance (e.g. RI1 and RI2) setting so as to prevent elements of the integrated circuit from being damaged by an input overvoltage at the first node ISEN1. Therefore only two nodes CRT and ISEN1 are used by the apparatus 100 of LED short detection of an embodiment of the present invention.

In an embodiment, as shown in FIG. 4C, the apparatus 100 enters a third detecting mode (non-detecting mode). In the third detecting mode, it is assumed that a total voltage across the first LED string LEDs1 with short circuit is smaller than the first node voltage V_ISEN1 at the first node ISEN1 when the voltage generator 101 enters the dimming off state, and that the LED string LEDs1 may only include one light emitting diode. Thus the mode control circuit 106 may select the third detecting mode by turning on the switch SW2 and turning off the switches SW1 and SW3 to cause the second node CRT to be coupled to the GPIO circuit 107 without being coupled to the voltage generator 101. In this state, the apparatus 100 of an embodiment of the present invention does not need to use the voltage generator 101, and the second node CRT does not provide a digital dimming signal to the high voltage device M1. Thus the high voltage device M1 can function normally according to a working voltage VX. In this way, only one node ISEN1 is used so that the apparatus 100 of LED short detection of an embodiment of the present invention can reduce pins of an integrated circuit to solve the problem of prior art.

Figure 4D:
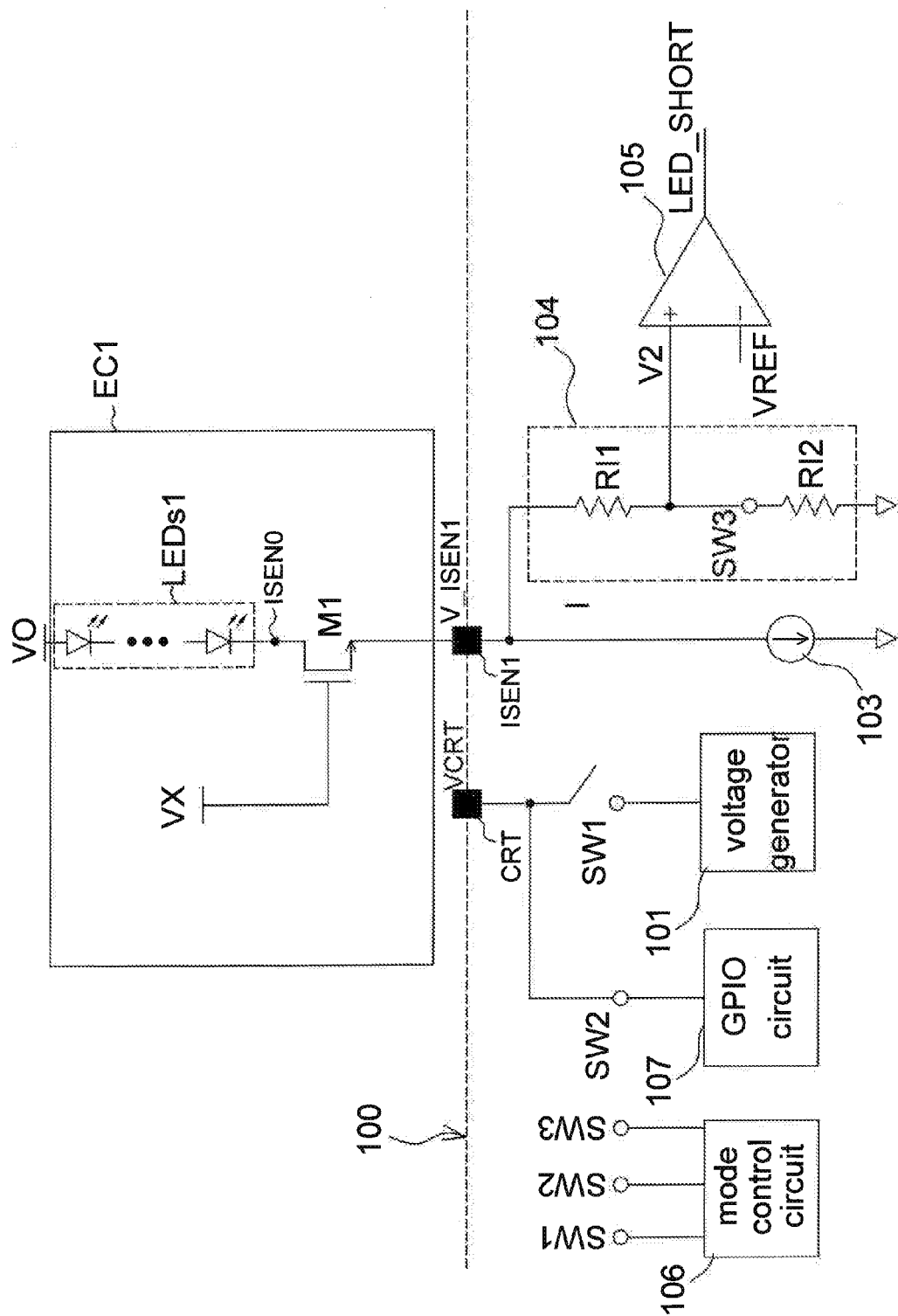
FIG. 4D shows another mode of an apparatus for LED short detection according to the present invention.

In an embodiment, as shown in FIG. 4D, the apparatus 100 enters a fourth detecting mode (non-detecting mode). In the fourth detecting mode, when the voltage generator 101 enters the dimming off state, it is assumed that a total voltage across the first LED string LEDs1 with short circuit is smaller than the first node voltage V_ISEN1 at the first node ISEN1 and a withstand voltage of elements of an integrated circuit is smaller than the first node voltage V_ISEN1 at the first node ISEN1. For protecting an Integrated circuit, the mode control circuit 106 selects the fourth detecting mode by turning on the switches SW2 and SW3, and turning off the switch SW1 to control the second voltage divider 104 to divide the first node voltage V_ISEN1. Thus the voltage V2 at the non-inverting input end generated by the second voltage divider 104 is smaller than the withstand voltage of the elements of the integrated circuit so as to prevent elements of the integrated circuit from being damaged by an input overvoltage on the first node ISEN1. Therefore only one node ISEN1 is used by the apparatus 100 of LED short detection of an embodiment of the present invention.

In summary, the apparatus and method of embodiments of the invention use the mode control circuit to select modes to switch modes of shirt circuit detection of an integrated circuit so as to share pins with elements of the integrated circuit. Therefore problems in prior art can be solved and cost of production can be saved.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An apparatus for detecting a status of at least one of a plurality of first light emitting diodes (LEDs) in a first external circuit, the apparatus comprising:
    a first node and a second node, coupled to the first external circuit;
    a voltage generator, to generate an output voltage to the first external circuit via the second node;
    a current source, coupled to the first external circuit via the first node, to provide a current to the first external circuit via the first node to generate a first node voltage at the first node; and
    a first comparator, coupled to the first node, to generate a first comparison result according to the first node voltage and a reference voltage;
    wherein the first comparison result indicates whether the status of at least one of the first LEDs is short or not.

2. The apparatus of claim 1, wherein the first external circuit further comprises a first high voltage device, coupled between the LEDs and the current source, wherein a gate of the first high voltage device receives a control voltage and the first high voltage device is on or off status according to the control voltage.

3. The apparatus of claim 2, wherein the first external circuit further comprises a first voltage divider, coupled to the second node and the gate of the first high voltage device, to generate the control voltage.

4. The apparatus of claim 1, wherein the first external circuit further comprises a high voltage transistor which operates in a linear region.

5. The apparatus of claim 1, further comprising:
    a third node, coupled to a second external circuit, wherein the second external circuit comprises a plurality of second LEDs connected in series; and
    a second comparator, coupled to the third node, to generate a second comparison result according to a voltage at the third node and the reference voltage, wherein the second comparison result indicates whether the status of at least one of the second LEDs is short or not.

6. The apparatus of claim 1, the voltage generator comprising:
    a first transistor and a second transistor, wherein the first transistor coupled between the second transistor and the second node,
    wherein a breakdown voltage of the second transistor is different from a breakdown voltage of the first transistor.

7. The apparatus of claim 6, wherein the breakdown voltage of the second transistor is higher than the breakdown voltage of the first transistor.

8. The apparatus of claim 1, the voltage generator comprising:
    a first transistor and a second transistor, wherein the first transistor coupled between the second transistor and the second node; and
    a plurality of diodes coupled in series, wherein one of the diodes is coupled to the second node.

9. The apparatus of claim 8, wherein a breakdown voltage of the second transistor is different from a breakdown voltage of the first transistor.

10. The apparatus of claim 8, wherein a breakdown voltage of the second transistor is higher than or equal to a breakdown voltage of the first transistor.

11. The apparatus of claim 1, further comprising:
    a mode control circuit having a plurality of operation modes; wherein the mode control circuit controls a plurality switches to perform a corresponding operation mode.

12. The apparatus of claim 11, wherein the mode control circuit controls a first switch of the plurality of switches such that the voltage generator is coupled to the second node.

13. The apparatus of claim 12, wherein the apparatus further comprises a second voltage divider coupled between an input of the first comparator and the first node, wherein the mode control circuit controls a third switch of the plurality of switches to allow the second voltage divider to divide the first node voltage.

14. The apparatus of claim 11, wherein the mode control circuit controls the plurality of switches such that an internal circuit is coupled to the second node, and the voltage generator is not coupled to the second node.

15. A method for detecting a status of a first light emitting diode (LED) string, wherein the first LED string comprises a plurality of first LEDs connected in series and the first LED string is coupled to a high-voltage device, the method comprising:

providing a first current to the first LED string of a first external circuit via a first node and the high voltage device;

providing a control voltage to a control input of the high-voltage device to generate a first node voltage at the first node according to the first current flowing through the first LED string; and generating a first comparison result according to the first node voltage and a reference voltage; wherein the first comparison result indicates whether the status of at least one of LEDs in the first LED string is short.

16. The method of claim 15, further comprising:
controlling a first switch of the plurality of switches such that an output voltage is provided to the first external circuit in a detecting mode.

17. The method of claim 15, further comprising:
coupling the second node to an internal circuit.

* * * * *